(12) United States Patent
Kamimura et al.

(10) Patent No.: US 9,971,387 B2
(45) Date of Patent: May 15, 2018

(54) COOLING FOR ELECTRONIC EQUIPMENT

(71) Applicant: Lenovo (Singapore) Pte. Ltd., Singapore (SG)

(72) Inventors: Takuroh Kamimura, Kanagawa-ken (JP); Tsutomu Chonan, Kanagawa-ken (JP); Takateru Adachi, Kanagawa-ken (JP); Kazuya Tatsuno, Kanagawa-ken (JP); Shogo Akiyama, Kanagawa-ken (JP)

(73) Assignee: Lenovo (Singapore) Pte. Ltd., Singapore (SG)

( * ) Notice: Subject to any disclaimer, the term of this patent is extended or adjusted under 35 U.S.C. 154(b) by 238 days.

(21) Appl. No.: 14/140,207

(22) Filed: Dec. 24, 2013

(65) Prior Publication Data

US 2014/0185231 A1 Jul. 3, 2014

(30) Foreign Application Priority Data

Dec. 27, 2012 (JP) ................... 2012-285489

(51) Int. Cl.
*H05K 7/20* (2006.01)
*G06F 1/20* (2006.01)
*H01L 23/427* (2006.01)

(52) U.S. Cl.
CPC ............... *G06F 1/20* (2013.01); *G06F 1/203* (2013.01); *H01L 23/427* (2013.01); *Y10T 29/49826* (2015.01)

(58) Field of Classification Search
CPC ............ G06F 1/20–1/206; G06F 1/203; G06F 2200/1631; Y10T 29/49826; H05K 7/20136–7/20154
See application file for complete search history.

(56) References Cited

U.S. PATENT DOCUMENTS

| 7,312,985 | B2 * | 12/2007 | Lee | ............ | G06F 1/203 |
| | | | | | 165/122 |
| 7,325,590 | B2 * | 2/2008 | Kim | ............ | G06F 1/203 |
| | | | | | 165/104.21 |
| 7,466,548 | B2 * | 12/2008 | Ishikawa | ............ | G06F 1/203 |
| | | | | | 165/104.33 |
| 7,474,526 | B2 * | 1/2009 | Fujiwara | ............ | G06F 1/203 |
| | | | | | 165/104.21 |

(Continued)

FOREIGN PATENT DOCUMENTS

| JP | H11163567 A | 6/1999 |
| JP | 2000075960 A | 3/2000 |

(Continued)

*Primary Examiner* — Robert J Hoffberg
*Assistant Examiner* — Matt Dhillon
(74) *Attorney, Agent, or Firm* — Ference & Associates LLC

(57) ABSTRACT

An embodiment provides an electronic device, including: a housing with an exhaust port and an intake port; a heat source contained in the housing; a heat transfer unit connected to the heat source; a first radiator located adjacent to the exhaust port, wherein the first radiator is connected to the heat transfer unit; a first blower fan, wherein the first blower fan discharges heat transmitted to the first radiator; and a second radiator located adjacent to the intake port, wherein the second radiator is connected to the heat transfer unit. Other embodiments are described and claimed.

17 Claims, 10 Drawing Sheets

(56) References Cited

U.S. PATENT DOCUMENTS

| | | | | |
|---|---|---|---|---|
| 7,529,088 B2* | 5/2009 | Chiu | ............... | F04D 29/161 361/694 |
| 7,589,965 B2* | 9/2009 | Liang | ............... | H05K 7/20154 165/104.33 |
| 7,675,752 B2* | 3/2010 | Hongo | ............... | G06F 1/203 165/121 |
| 7,710,724 B2* | 5/2010 | Takeguchi | ............... | G06F 1/203 165/104.33 |
| 7,751,190 B2* | 7/2010 | Fujiwara | ............... | F28D 15/046 165/104.21 |
| 7,869,213 B2* | 1/2011 | Chen | ............... | G06F 1/203 165/121 |
| 7,965,512 B2* | 6/2011 | Huang | ............... | F28D 15/0266 165/104.33 |
| 7,990,706 B2* | 8/2011 | Miyahara | ............... | H01L 23/467 165/121 |
| 8,144,460 B2* | 3/2012 | Luo | ............... | G06F 1/203 165/80.3 |
| 8,153,310 B2* | 4/2012 | Hirayama | ............... | H01M 8/04007 361/697 |
| 8,405,997 B2* | 3/2013 | Fujiwara | ............... | G06F 1/203 165/80.2 |
| 8,482,916 B2* | 7/2013 | Wang | ............... | G06F 1/203 361/679.47 |
| 8,564,948 B2* | 10/2013 | Li | ............... | G06F 1/16 165/104.33 |
| 9,282,656 B2* | 3/2016 | Degner | ............... | H05K 5/02 |
| 2005/0094371 A1* | 5/2005 | Lai | ............... | G06F 1/203 361/679.48 |
| 2007/0177350 A1* | 8/2007 | Hata | ............... | G06F 1/203 361/697 |
| 2007/0280818 A1* | 12/2007 | Yang | ............... | F04D 29/161 415/102 |
| 2009/0103262 A1* | 4/2009 | Hata | ............... | G06F 1/203 361/689 |
| 2009/0229791 A1* | 9/2009 | Hung | ............... | G06F 1/20 165/80.3 |
| 2012/0170207 A1* | 7/2012 | Li | ............... | G06F 1/16 361/679.47 |
| 2014/0028115 A1* | 1/2014 | Zhang | ............... | G06F 1/206 307/125 |
| 2014/0355197 A1* | 12/2014 | Aruga | ............... | G06F 1/203 361/679.27 |
| 2015/0016052 A1* | 1/2015 | Gwin | ............... | G06F 1/20 361/679.46 |

FOREIGN PATENT DOCUMENTS

| | | |
|---|---|---|
| JP | 2004013843 A | 1/2004 |
| JP | 2005158013 A | 6/2005 |
| JP | 2005167102 A | 6/2005 |
| JP | 2010008905 A | 1/2010 |
| WO | 2012120830 A1 | 9/2012 |

* cited by examiner

COOLING FOR ELECTRONIC EQUIPMENT

CLAIM FOR PRIORITY

This application claims priority from Japanese Patent Application No. 2012-285489, filed on Dec. 27, 2012, and which is fully incorporated by reference as if fully set forth herein.

FIELD

The subject matter described herein relates to electronic equipment, an electronic equipment system, a cooling method for the electronic equipment, and a cooling method for the electronic equipment system.

BACKGROUND

Among pieces of electronic equipment such as a laptop personal computer, there is electronic equipment attached to an extended device not only to add an extended function to the electronic equipment but also to enhance the cooling function of the electronic equipment. The electronic equipment includes a heat source such as a CPU (Central Processing Unit) (arithmetic processor) mounted inside a housing, a heat transfer unit such as a heat sink connected to the heat source to transmit heat generated by the heat source up to the vicinity of an exhaust port provided in the housing, and a blower fan for discharging the heat transmitted to the vicinity of the exhaust port to the outside of the housing together with air. Then, the heat generated by the heat source is transmitted up to the vicinity of the exhaust port, and discharged to the outside of the housing together with air. The extended device provides the housing with a cooling air passage that communicates with the exhaust port, and includes a blower fan facing the exhaust port and a heat transfer unit such as a heat sink that borders the bottom face of the electronic equipment attached to the extended device. When the electronic equipment is attached to the extended device, the exhaust port lies just below the heat source mounted in the electronic equipment, and the cooling air passage runs just below the heat transfer unit. Then, the air discharged from the exhaust port in such a state that the electronic equipment is attached to the extended device passes under the heat source mounted in the electronic equipment, under the heat transfer unit, and through the heat transfer unit that borders the bottom face of the electronic equipment attached to the extended device, and is discharged to the outside of the housing (for example, see Japanese patent application publication No. 2000-75960).

Further, among pieces of electronic equipment such as a tablet personal computer, there is proposed electronic equipment also usable as a laptop personal computer by being attached to an extended device to add an extended function to the electronic equipment. Thus, the electronic equipment can be used as a tablet personal computer independently, and by being attached to the extended device, the electronic equipment can be used as a laptop personal computer (for example, see Japanese patent application publication No. 2005-158013).

BRIEF SUMMARY

In summary, one aspect provides an electronic device, comprising: a housing with an exhaust port and an intake port; a heat source contained in said housing; a heat transfer unit connected to said heat source; a first radiator located adjacent to said exhaust port, wherein said first radiator is connected to said heat transfer unit; a first blower fan, wherein said first blower fan discharges heat transmitted to said first radiator; and a second radiator located adjacent to said intake port, wherein said second radiator is connected to said heat transfer unit.

Another aspect provides electronic device, comprising a housing including a processor and a memory; said housing configured with an exhaust port and an intake port; a heat transfer unit thermally coupled to said processor; and a first radiator located adjacent to said intake port and thermally coupled to said heat transfer unit.

A further aspect provides a method, comprising: disposing a processor and a memory within a housing of an electronic device; the housing configured with an exhaust port and an intake port; and thermally coupling a first radiator to said processor, said first radiator being disposed adjacent to said intake port.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the invention will be pointed out in the appended claims.

DETAILED DESCRIPTION

Figure 1:
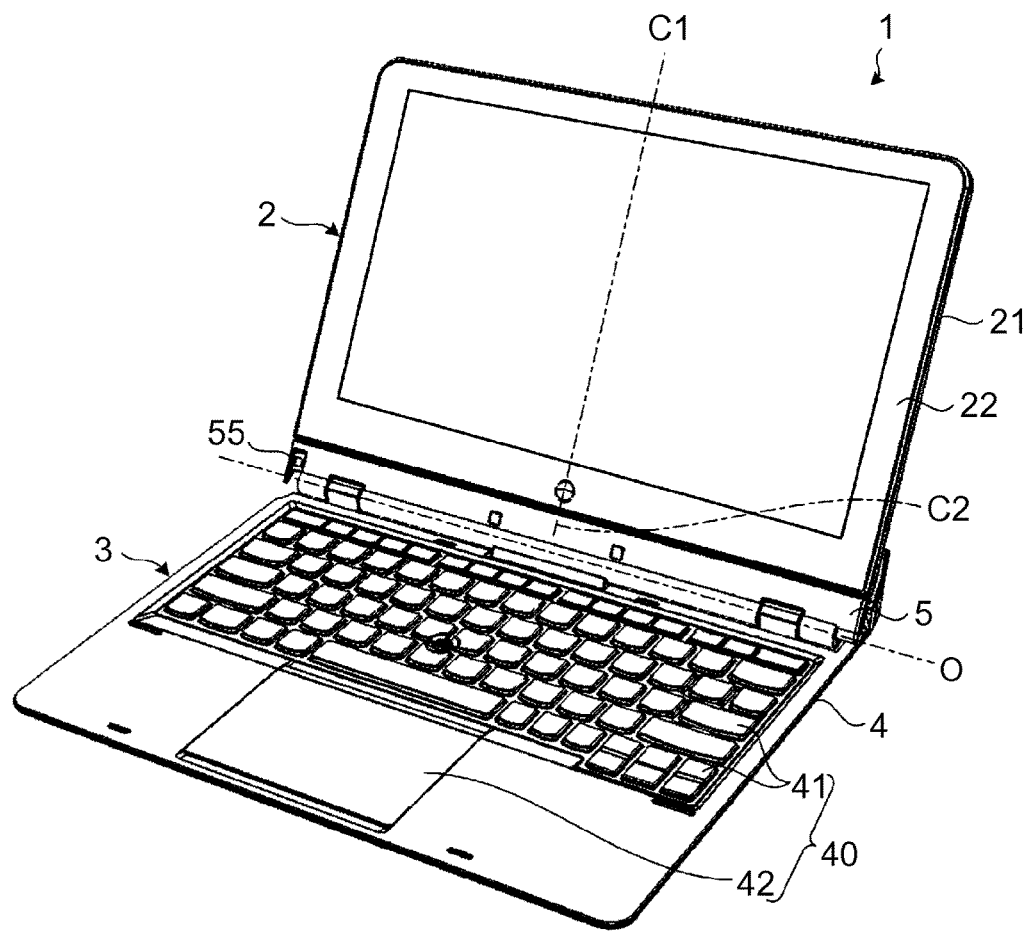
FIG. 1 is a perspective view showing a laptop personal computer as an embodiment.

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

Reference throughout this specification to "one embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well known structures, materials, or operations are not shown or described in detail to avoid obfuscation.

As the performance of the heat source such as the CPU is improved, the amount of heat generation increases. In electronic equipment, such as a tablet personal computer or a laptop personal computer, which is made thinner and hence the internal space is limited, it is difficult to cool the heat source such as the CPU. Therefore, it is difficult for the electronic equipment with its internal space limited to mount a high-performance CPU therein. Even if a high-performance CPU is mounted, the CPU will be damaged by heat as the amount of heat generation increases, and hence the CPU cannot provide its performance sufficiently.

An embodiment has been made in view of the above circumstances, and it is an object thereof to provide electronic equipment and an electronic equipment system capable of cooling a heat source efficiently, and a cooling method for the electronic equipment and a cooling method for the electronic equipment system.

In order to solve the above problem and attain the above object, an embodiment provides electronic equipment including a heat source mounted inside a housing, a radiator provided inside the housing to face an exhaust port provided in the housing, a heat transfer unit connected to the heat source and the radiator to transmit heat generated by the heat source to the radiator, and a blower fan for discharging heat transmitted to the radiator together with air, characterized by including: an intake-side radiator provided inside the housing to face an intake port provided in the housing; and an intake-side heat transfer unit connected to the heat source and the intake-side radiator to transmit heat generated by the heat source to the intake-side radiator.

In the above embodiment, the present embodiment is characterized in that the heat source is an arithmetic processor.

In the above embodiment, the present embodiment is also characterized in that the intake-side heat transfer unit is formed integrally with the heat transfer unit.

In the above embodiment, the present embodiment is further characterized in that the housing has the shape of a flat box the front of which is open, and a display is provided in the front opening.

An embodiment is also characterized by including: an electronic equipment body including a heat source mounted inside a housing, a radiator provided inside the housing to face an exhaust port provided in the housing, a heat transfer unit connected to the heat source and the radiator to transmit heat generated by the heat source to the radiator, a blower fan for discharging heat transmitted to the radiator together with air, an intake-side radiator provided inside the housing to face an intake port provided in the housing, and an intake-side heat transfer unit connected to the heat source and the intake-side radiator to transmit heat generated by the heat source to the intake-side radiator; and an extended device to which the electronic equipment body can be attached and which includes a blower fan for supplying air to the intake port in a state of attaching the electronic equipment body thereto.

In the above embodiment, the present embodiment is characterized in that the heat source is an arithmetic processor.

In the above embodiment, the present embodiment is also characterized in that the intake-side heat transfer unit is formed integrally with the heat transfer unit.

In the above embodiment, the present embodiment is further characterized in that the housing has the shape of a flat box the front of which is open, and a display is provided in the front opening.

Further, in the above embodiment, the present embodiment is characterized in that the intake port is provided in the center of a lower edge of the housing symmetrically about the center of the lower edge as a boundary.

An embodiment is further characterized by including: electronic equipment including a heat source mounted inside a housing, a radiator provided inside the housing to face an exhaust port provided in the housing, a heat transfer unit connected to the heat source and the radiator to transmit heat generated by the heat source to the radiator, a blower fan for discharging heat transmitted to the radiator together with air, an intake-side radiator provided inside the housing to face an intake port provided in the housing, and an intake-side heat transfer unit connected to the heat source and the intake-side radiator to transmit heat generated by the heat source to the intake-side radiator; and an extended device to which the electronic equipment can be attached and which includes a blower fan for supplying air to the intake port in a state of attaching the electronic equipment thereto.

In the above embodiment, the present embodiment is characterized in that the heat source is an arithmetic processor.

In the above embodiment, the present embodiment is also characterized in that the intake-side heat transfer unit is formed integrally with the heat transfer unit.

In the above embodiment, the present embodiment is further characterized in that the housing has the shape of a flat box the front of which is open, and a display is provided in the front opening.

Further, in the above embodiment, the present embodiment is characterized in that the intake port is provided in the center of a lower edge of the housing symmetrically about the center of the lower edge as a boundary.

An embodiment provides a cooling method for electronic equipment, characterized by including: transmitting heat generated by a heat source mounted inside a housing to a radiator provided to face an exhaust port and an intake-side radiator provided to face an intake port; and radiating heat not only into air forcibly discharged from the exhaust port but also into air taken in from the intake port.

An embodiment also provides a cooling method for electronic equipment, which includes transmitting heat generated by a heat source mounted inside a housing to a radiator provided to face an exhaust port and an intake-side radiator provided to face an intake port, and radiating heat not only into air forcibly discharged from the exhaust port but also into air taken in from the intake port, characterized in that when an electronic equipment body is used independently, air is taken in from the intake port by a negative pressure inside the housing, while when the electronic equipment body is attached to an extended device, air is forcibly supplied from the extended device to the intake port.

An embodiment further provides a cooling method for an electronic equipment system, which includes transmitting heat generated by a heat source mounted inside a housing to a radiator provided to face an exhaust port and an intake-side radiator provided to face an intake port, and radiating heat not only into air forcibly discharged from the exhaust port but also into air taken in from the intake port, characterized in that when electronic equipment is used independently, air is taken in from the intake port by a negative pressure inside the housing, while when the electronic equipment is attached to an extended device, air is forcibly supplied from the extended device to the intake port.

The electronic equipment according to an embodiment includes the intake-side radiator provided inside the housing to face the intake port provided in the housing, and the intake-side heat transfer unit connected to the heat source and the intake-side radiator to transmit heat generated by the heat source to the intake-side radiator. Since the heat generated by the heat source is also radiated into air taken in from the intake port, the heat source can be cooled efficiently.

The electronic equipment according to an embodiment includes: the electronic equipment body including the intake-side radiator provided inside the housing to face the intake port provided in the housing, and the intake-side heat transfer unit connected to the heat source and the intake-side radiator to transmit heat generated by the heat source to the intake-side radiator; and the extended device to which the electronic equipment body can be attached and which includes the blower fan for supplying air to the intake port in a state of attaching the electronic equipment body thereto. Since the heat generated by the heat source is also radiated into air forcibly supplied from the extended device to the intake port, the heat source can be cooled efficiently.

The electronic equipment system according to an embodiment includes: the electronic equipment including the intake-side radiator provided inside the housing to face the intake port provided in the housing, and the intake-side heat transfer unit connected to the heat source and the intake-side radiator to transmit heat generated by the heat source to the intake-side radiator; and the extended device to which the electronic equipment can be attached and which includes the blower fan for supplying air to the intake port in a state of attaching the electronic equipment thereto. Since the heat generated by the heat source is also radiated into air forcibly supplied from the extended device to the intake port, the heat source can be cooled efficiently.

The cooling method for the electronic equipment according to an embodiment includes: transmitting heat generated by the heat source mounted inside the housing to the radiator provided to face the exhaust port and the intake-side radiator provided to face the intake port; and radiating heat not only into air forcibly discharged from the exhaust port but also into air taken in from the intake port. Thus, the heat source can be cooled efficiently.

The cooling method for the electronic equipment according to an embodiment such that, when the electronic equipment body is used independently, air is taken in from the intake port by a negative pressure inside the housing, while when the electronic equipment body is attached to the extended device, air is forcibly supplied from the extended device to the intake port. Thus, when the electronic equipment body is attached to the extended device, the heat source can be cooled more efficiently.

The cooling method for the electronic equipment system according to an embodiment such that, when the electronic equipment is used independently, air is taken in from the intake port by a negative pressure inside the housing, while when the electronic equipment is attached to the extended device, air is forcibly supplied from the extended device to the intake port. Thus, when the electronic equipment is attached to the extended device, the heat source can be cooled more efficiently.

Electronic equipment, an electronic equipment system, and a cooling method for the electronic equipment according to the embodiment, and an embodiment of the electronic equipment will be described below with reference to the accompanying drawings. Here, a description will be made by taking, as an example, a laptop personal computer with a tablet personal computer attached to an extended device, but not limited to this embodiment.

Figure 2:
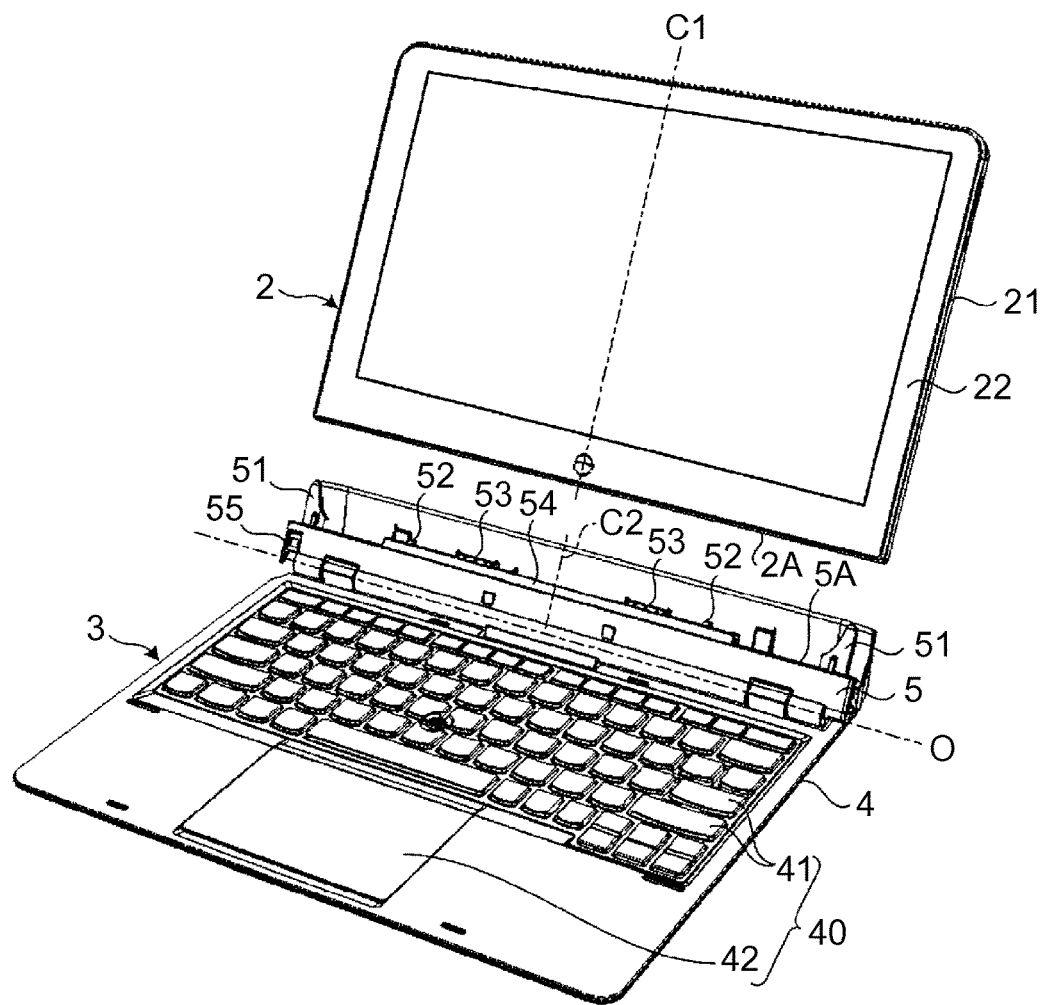
FIG. 2 is a perspective view showing a state where a tablet personal computer is detached from an extended device in the laptop personal computer shown in FIG. 1.
Figure 3:
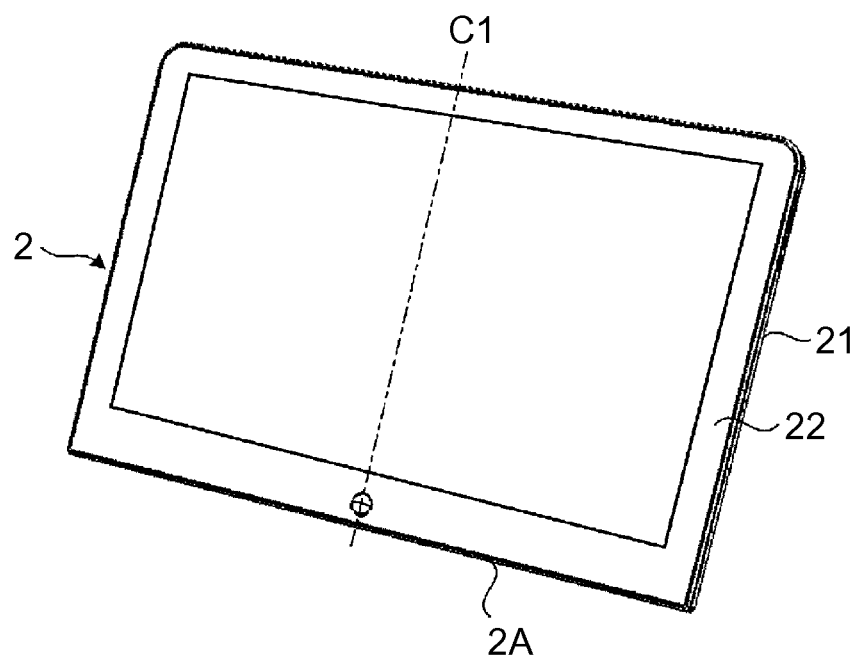
FIG. 3 is a perspective view showing the tablet personal computer shown in FIG. 2.
Figure 4:
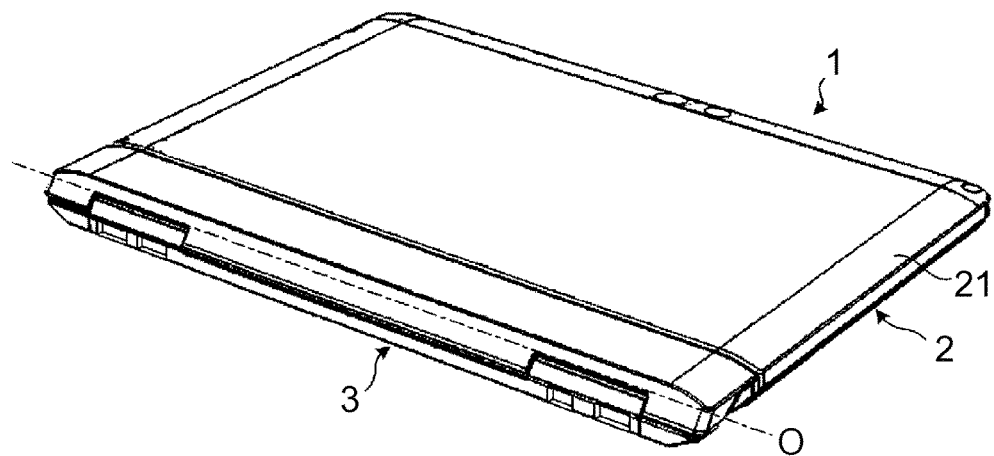
FIG. 4 is a perspective view showing a state where the laptop personal computer shown in FIG. 1 is folded.

FIG. 1 is a perspective view showing a laptop personal computer as an embodiment, FIG. 2 is a perspective view showing a state where a tablet personal computer is detached from an extended device in the laptop personal computer shown in FIG. 1, FIG. 3 is a perspective view showing the tablet personal computer shown in FIG. 2, and FIG. 4 is a perspective view showing a state where the laptop personal computer shown in FIG. 1 is folded.

As shown in FIG. 1 to FIG. 4, a laptop personal computer 1 as an embodiment, made up by removably attaching a tablet personal computer 2 to an extended device 3. The tablet personal computer 2 is attached to the extended device 3 and used as the laptop personal computer 1 as shown in FIG. 1 and FIG. 4, or the tablet personal computer 2 is used independently as shown in FIG. 3.

The tablet personal computer 2 is equipped with a pair of mounting holes (not shown) and a pair of hook holes (not shown) in a lower face 2A (see FIG. 2 and FIG. 3) to be attached to the extended device 3. When the tablet personal computer 2 is attached to the extended device 3, parts of the extended device 3 (a pair of insertion parts 51 provided in a mounting part 5 (see FIG. 2)) are inserted into the pair of mounting holes, and the pair of mounting holes are supported by the parts. The pair of mounting holes are provided symmetrically about a center line C1 in a width direction of the tablet personal computer 2 as a boundary. The positions of the mounting holes are both end portions in the width direction of the tablet personal computer 2, and the entrance of each mounting hole is shaped into a rectangle elongated in the width direction of the tablet personal computer 2.

When the tablet personal computer 2 is attached to the extended device 3, parts of the extended device 3 (a pair of hooks 52 provided in the mounting part 5 (see FIG. 2)) are inserted into the pair of hook holes, and the pair of hook holes are locked together with the parts. The pair of hook holes are provided symmetrically about the center line C1 in the width direction of the tablet personal computer 2 as the boundary. The positions of the hook holes are two positions (one-fourth position and three-fourth position) obtained by dividing the tablet personal computer 2 into quarters in the width direction.

The tablet personal computer 2 is also configured such that a pair of connectors (not shown) are provided in the lower face 2A to be attached to the extended device 3. The pair of connectors are input/output terminals to attain data input/output, and the connection end face of each connector is provided to be flush with or dented inward from the lower face 2A of the tablet personal computer 2. The pair of connectors are shaped into an elongated rectangle and provided symmetrically about the center line C1 in the width direction of the tablet personal computer 2 as the boundary.

As shown in FIG. 1, the extended device 3 is used by attaching the tablet personal computer 2 thereto, having substantially the same width as that of the tablet personal computer 2. As shown in FIG. 1 and FIG. 2, the extended device 3 is equipped with an extended device body 4 and the mounting part 5, both of which have substantially the same width as that of the tablet personal computer 2. As shown in FIG. 1, when the tablet personal computer 2 is attached and used as the laptop personal computer 1, the extended device body 4 is put on the top of a desk or a user's lap. A keyboard 40 made up of operation keys 41 and a touch pad 42 is provided on the upper face of the extended device body 4.

As shown in FIG. 2, the mounting part 5 is a part to which the tablet personal computer 2 is attached. As shown in FIG. 1 and FIG. 4, the mounting part 5 is rotatably mounted on the extended device body 4, and a rotation center O of the mounting part 5 is so placed on the extended device body 4 that some depth of the extended device body 4 will remain behind the rotation center O. The extended device 3 placed on the extended device body 4 in such a manner that some depth of the extended device body 4 will remain behind the rotation center O is supported by a region (depth) behind the rotation center O even when the weight of the tablet personal computer 2 to be attached is heavier than the lid body of a conventional laptop personal computer, and does not fall on the side of the tablet personal computer 2.

As shown in FIG. 2, a mounting end face 5A is provided in the mounting part 5. The mounting end face 5A is a face butted against the lower face 2A of the tablet personal computer 2 to be attached, and formed in parallel with the rotation center O mentioned above. The mounting end face 5A has substantially the same width as that of the tablet personal computer 2, and a pair of connectors 53 are provided in the mounting end face 5A. The pair of connectors 53 are input/output terminals to which the connectors provided in the lower face of the tablet personal computer 2 are connected to attain data input/output, and the connection end face of each connector is provided to project upward from the mounting end face 5A of the mounting part 5. The pair of connectors 53 are provided symmetrically about a center line C2 in the width direction of the mounting part 5 as a boundary with the connection end face shaped into an elongated rectangle.

As shown in FIG. 2, the mounting part 5 is also configured such that a pair of insertion parts 51 are provided on the mounting end face 5A. When the tablet personal computer 2 is attached to the mounting part 5, the pair of insertion parts 51 are inserted into the mounting holes provided in the lower face 2A of the tablet personal computer 2 to support the tablet personal computer 2 (see FIG. 1). As shown in FIG. 2, the pair of insertion parts 51 are provided symmetrically about the center line C2 in the width direction of the mounting part 5 as the boundary. The positions of the insertion parts 51 are both end portions in the width direction of the mounting part 5, and each of the insertion parts 51 has the cross-sectional shape of a rectangle elongated in the width direction of the mounting part 5. The outer side face of the insertion parts 51 is formed perpendicularly to the mounting end face 5A, and the inside side face is formed in a concave curved shape.

Further, the mounting part 5 is equipped with a slider (not shown) and a connector cover 54. The slider is slidable in the width direction of the mounting part 5 with respect to the mounting part 5, and a tensile coil spring (not shown) is stretched over between the mounting part 5 and the slider. Thus, an elastic recovery force acts on the tensile coil spring and the slider is urged from a standby position toward a locking position. A pair of hooks 52 projecting from the mounting end face 5A of the mounting part 5 are provided on the upper face of the slider, and an eject knob 55 in an end portion (left end portion) as the locking position side relative to the standby position.

The pair of hooks 52 is to make sure that the tablet personal computer 2 is attached to the mounting part 5. In the standby position, the pair of hooks 52 face the pair of hook holes provided in the lower face of the tablet personal computer 2 to be attached, and in the locking position, the pair of hooks 52 are locked together with the pair of hook holes provided in the lower face of the tablet personal computer 2 attached.

The eject knob 55 is to move the slider from the locking position to the standby position. When the slider is positioned in the locking position, the eject knob 55 projects from the end face (left end face) of the mounting part 5 as the locking position side relative to the standby position. When the eject knob 55 is pushed in from this situation against the elastic recovery force of the tensile coil spring, the slider moves beyond the standby position from the locking position to an eject position.

The connector cover 54 is slidable up and down with respect to the mounting part 5, and a compression coil spring (not shown) is contained between the mounting part 5 and the connector cover 54. Thus, an elastic recovery force acts on the compression coil spring and the connector cover 54 is urged upward. A pair of connector holes (not shown) and a pair of hook holes (not shown) are provided in the connector cover 54.

Each of the connector holes is an opening in which each connector 53 provided in the mounting part 5 moves back and forth, and is formed in the shape of an elongated rectangle into which the connector 53 provided in the mounting part 5 is inserted. Thus, the connection end face of the connector 53 provided in the mounting part 5 is retreated to a position flush with or lower than the upper face of the connector cover 54. When the connector cover 54 is pushed in from this situation against the elastic recovery force of the compression coil spring, the connector cover 54 is pushed downward and the connector 53 provided in the mounting part 5 projects from the connector cover 54. Thus, when the connector 53 provided in the mounting part 5 projects from the upper face of the connector cover 54, the connector provided in the lower face of the tablet personal computer 2 becomes connectable to the connector 53 provided in the mounting part 5.

Each of the hook holes is an opening into which each hook 52 is inserted, and is formed in the shape of an elongated rectangle so that the hook 52 inserted in the hook hole can move between the eject position and the locking position. Thus, when only the tip of the hook 52 projects from the upper face of the connector cover 54 and the connector cover 54 is pushed downward, the entire hook 52 projects from the upper face of the connector cover 54. The entire hook 52 projecting from the upper face of the connector cover 54 can be inserted into the hook hole in the standby position, and when the hook moves from the standby position to the locking position in a state of being inserted in the hook hole, the hook is locked together with the hook hole.

Figure 5:
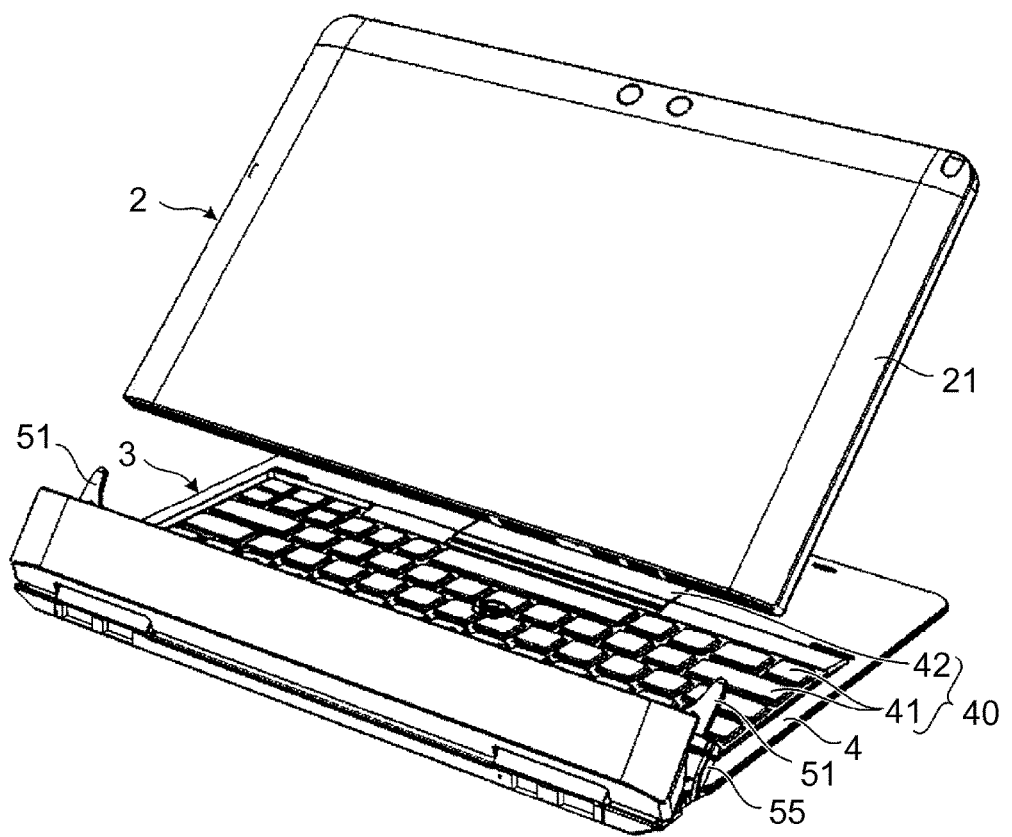
FIG. 5 is a perspective view showing a state where the tablet personal computer is detached from the extended device in the laptop personal computer shown in FIG. 4.
Figure 6:
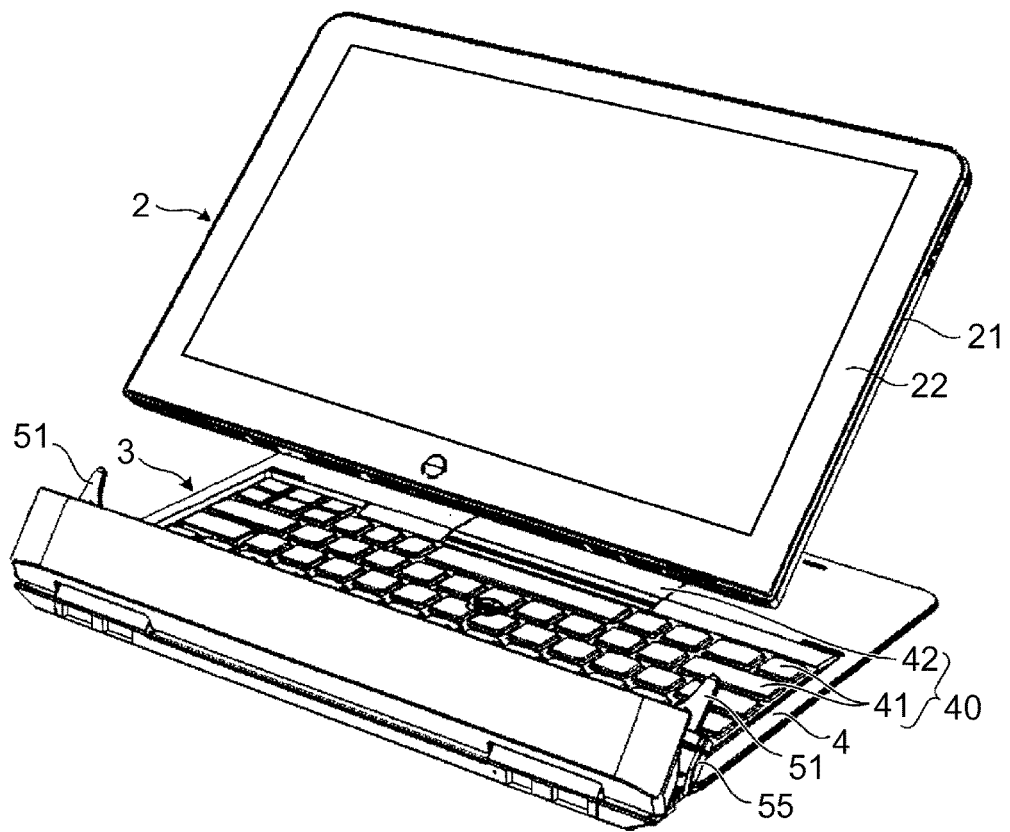
FIG. 6 is a perspective view showing a state where the tablet personal computer is reversed in the laptop personal computer shown in FIG. 5.
Figure 7:
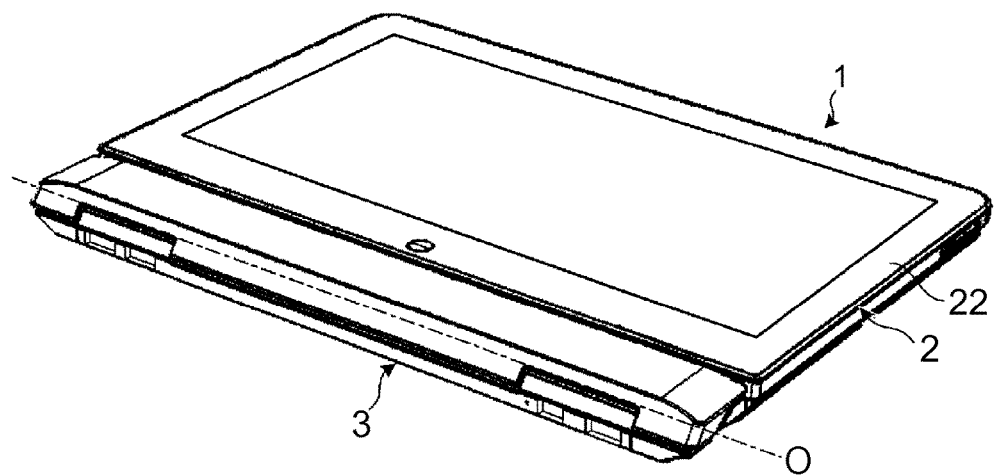
FIG. 7 is a perspective view showing a state where the tablet personal computer is attached to the extended device in the laptop personal computer shown in FIG. 6.

FIG. 5 is a perspective view showing a state where the tablet personal computer is detached from the extended device in the laptop personal computer shown in FIG. 4, FIG. 6 is a perspective view showing a state where the tablet personal computer is reversed in the laptop personal computer shown in FIG. 5, and FIG. 7 is a perspective view showing a state where the tablet personal computer is attached to the extended device in the laptop personal computer shown in FIG. 6.

The tablet personal computer 2 mentioned above can be configured not only to be attached to the extended device 3 and used as the laptop personal computer 1 as shown in FIG. 1, but also to be detached from the extended device 3 as shown in FIG. 2 and used independently as the tablet personal computer 2 as shown in FIG. 3.

Further, after being detached from the extended device 3 as shown in FIG. 5, the tablet personal computer 2 can be reversed as shown in FIG. 6, and attached to the extended device 3 as shown in FIG. 7. Thus, the laptop personal computer 1 as an embodiment constitutes not only electronic equipment of the embodiment but also an electronic equipment system, and the tablet personal computer 2 as an embodiment constitutes not only electronic equipment of the embodiment but also an electronic equipment body of the embodiment.

Figure 8:
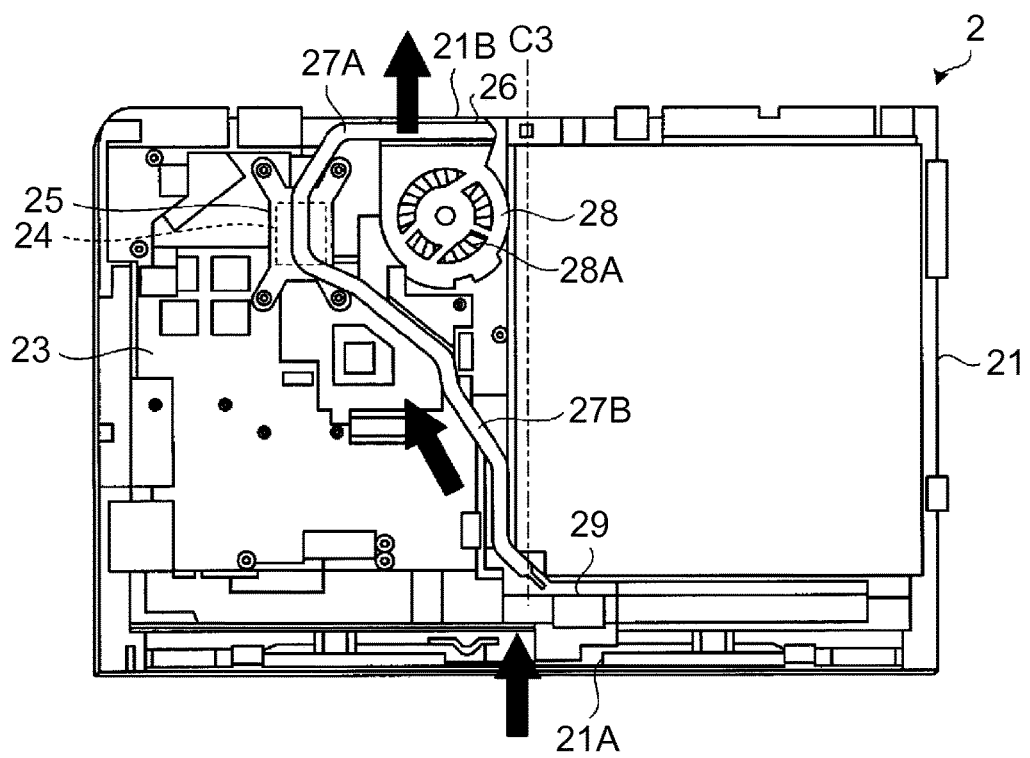
FIG. 8 is a diagram showing the internal structure of the tablet personal computer shown in FIG. 3.

FIG. 8 is a diagram showing the internal structure of the tablet personal computer. As shown in FIG. 1 to FIG. 3, the tablet personal computer 2 includes a housing 21 and a display 22. The housing 21 is formed in the shape of a flat box the front of which is open, and the display 22 is mounted to close the front opening. As shown in FIG. 8, an intake port 21A is formed in a central portion of the lower face of the housing 21. The intake port 21A is an opening for taking air into the inside of the housing 21, which is provided symmetrically about a center line C3 in a width direction of the housing 21 as a boundary. The intake port 21A is formed in the shape of a rectangle elongated in the width direction of the housing 21. It is preferred to provide multiple bars for dividing the intake port 21A into multiple blocks to prevent foreign substances from entering the inside of the housing 21 from the intake port 21A.

An exhaust port 21B is formed on the upper face of the housing 21. The exhaust port 21B is an opening for exhausting air inside the housing 21, and unlike the intake port 21A, the exhaust port 21B is provided in any position suited to exhaust the air. The exhaust port 21B is formed in a rectangular shape elongated along the width direction of the housing 21. It is preferred to provide multiple bars for dividing the intake port 21A into multiple blocks to prevent foreign substances from entering the inside of the housing 21 from the exhaust port 21B.

As shown in FIG. 8, a control board 23 is mounted between the housing 21 and the display 22 (see FIG. 3) to construct the inside of the housing 21. A CPU (Central Processing Unit)(arithmetic processor) 24 as a heat source is mounted on the control board 23. A heat spreader 25 is attached to the CPU 24 in a manner to adhere to the CPU 24 so that heat generated by the CPU 24 will be transmitted to the heat spreader 25. Thus, since the heat spreader 25 is handled integrally with the CPU 24, it can be considered as a heat source.

A fin 26 is also provided inside the housing 21 to face the exhaust port 21B provided in the housing 21. The fin 26 is provided to increase the surface area exposed to the air in order to enhance the cooling effect. The fin 26 constitutes a radiator.

A heat sink 27A is provided between the heat spreader (heat source) 25 and the fin 26. The heat sink 27A is to transmit heat from the heat source toward the fin 26, which is made of a material with excellent thermal conductivity.

A blower fan 28 is provided in the vicinity of the fin 26 in such a manner that the discharge port thereof faces the fin 26. The blower fan 28 is to discharge heat transmitted to the fin 26 together with air. In the embodiment, a centrifugal fan is used as the blower fan 28, where air is taken in from an intake port 28A provided on a face opposite to the housing 21 and a face opposite to the display 22 and discharged from a discharge port opposite to the fin 26.

Further, an intake-side fin 29 is provided inside the housing 21 to face the intake port 21A provided in the housing 21. Like the fin 26 mentioned above, the intake-side fin 29 is provided to increase the surface area exposed to the air in order to enhance the cooling effect. The intake-side fin 29 constitutes a radiator on the intake side.

An intake-side heat sink 27B is provided between the heat spreader (heat source) 25 and the intake-side fin 29. Like the heat sink 27A mentioned above, the intake-side heat sink 27B is to transmit heat from the heat source toward the intake-side fin 29, which is provided integrally with the above-mentioned heat sink 27A in the embodiment.

When the tablet personal computer 2 mentioned above is used independently, heat generated by the CPU 24 is transmitted to the fin 26 and the intake-side fin 29 via the heat sink 27A formed integrally with the intake-side heat sink 27B. The heat transmitted to the fin 26 is discharged to the outside of the housing 21 together with air supplied from the blower fan 28. On the other hand, the heat transmitted to the intake-side fin 29 is radiated into air taken by a negative pressure inside the housing that is caused by the blower fan 28.

Figure 9:
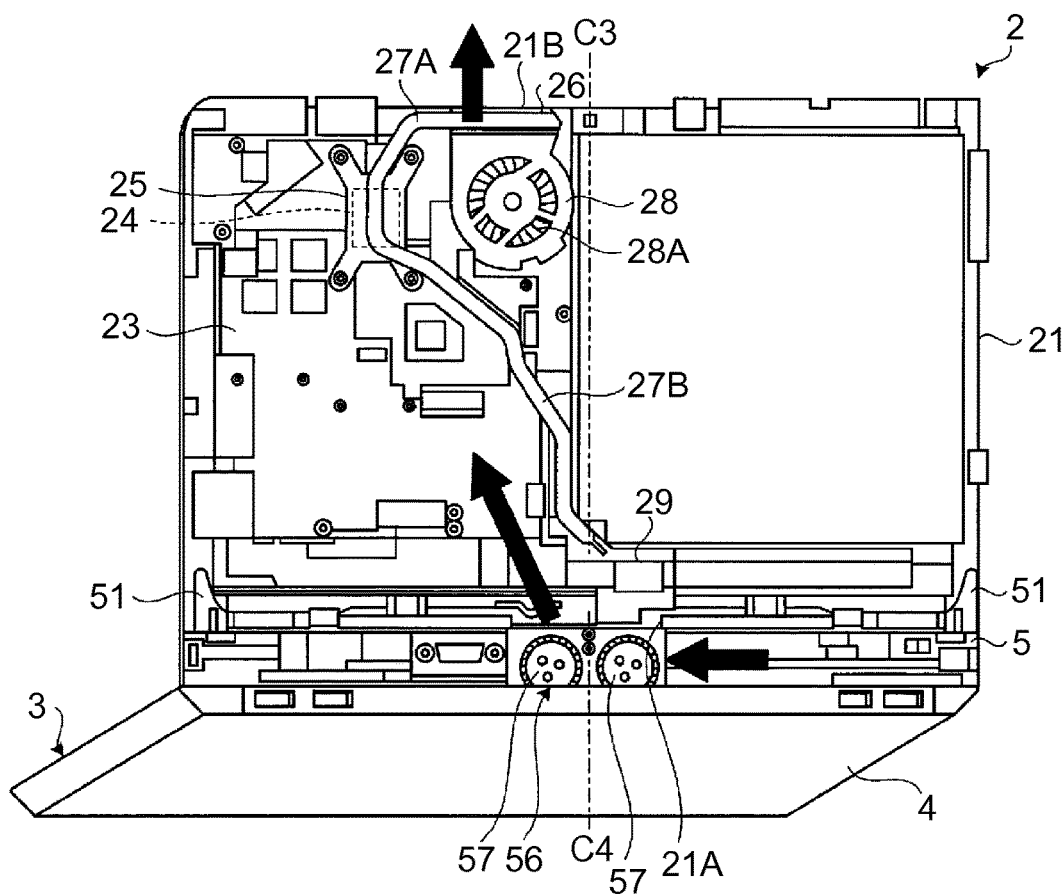
FIG. 9 is a diagram showing the internal structure of the tablet personal computer shown in FIG. 1.

FIG. 9 is a diagram showing the internal structure of the tablet personal computer shown in FIG. 1. As shown in FIG. 9, a fan unit 56 is provided in the mounting part 5 of the extended device 3 with the tablet personal computer 2 attached thereto. The fan unit 56 is to supply air to the intake port 21A when the tablet personal computer 2 is attached to the extended device 3, and a discharge port of the fan unit 56 is open to the mounting end face 5A to face the intake port 21A of the tablet personal computer 2 attached. Like the intake port 21A provided in the tablet personal computer 2, the discharge port of the fan unit 56 is provided symmetrically about a center line C4 in the width direction of the mounting part 5. The discharge port of the fan unit 56 is formed in the shape of a rectangle elongated along the width direction of the mounting part 5. It is preferred to provide multiple bars for dividing the discharge port of the fan unit 56 into multiple blocks to prevent foreign substances from entering the inside of the fan unit 56 from the discharge port of the fan unit 56.

The fan unit 56 is made up of a pair of blower fans 57. In the embodiment, a centrifugal fan is used as each blower fan 57, where air is taken in from an intake port provided on the front face and the rear face, and discharged from the discharge port of the fan unit 56.

When the tablet personal computer 2 mentioned above is attached to the extended device 3 and used, heat generated by the CPU 24 is transmitted to the fin 26 and the intake-side fin 29 via the heat sink 27A formed integrally with the intake-side heat sink 27B. The heat transmitted to the fin 26 is discharged to the outside of the housing 21 together with air supplied from the blower fan 28. On the other hand, the heat transmitted to the intake-side fin 29 is radiated into air forcibly supplied from the extended device 3.

Figure 10:
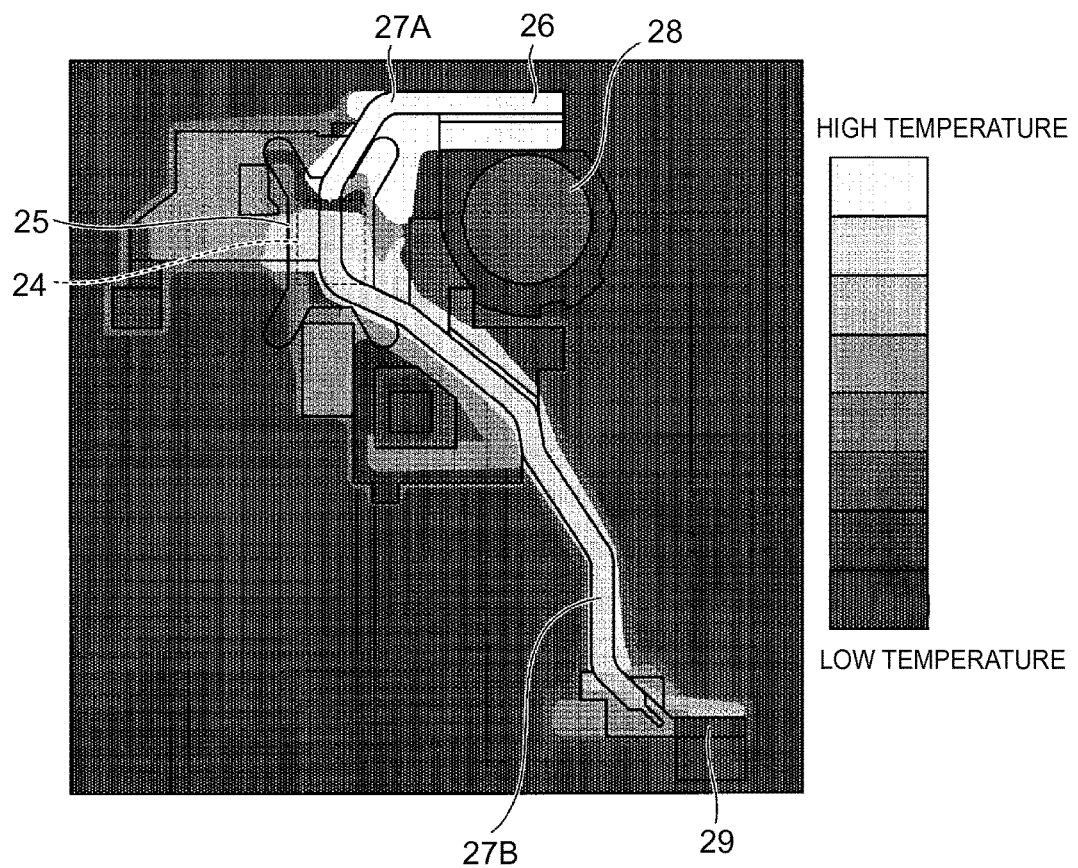
FIG. 10 is a diagram showing a heat distribution in the internal structure of the tablet personal computer shown in FIG. 8.

FIG. 10 is a diagram showing a heat distribution in the internal structure of the tablet personal computer shown in FIG. 8. As shown in FIG. 10, it is found that, even when the tablet personal computer 2 mentioned above is used independently, heat generated by the CPU 24 is transmitted to the fin 26 and the intake-side fin 29 via the heat sink formed integrally with the intake-side heat sink 27B. It is then found that the heat transmitted to the fin 26 is discharged to the outside of the housing 21 from the exhaust port 21B provided in the housing 21 together with air supplied from the blower fan 28, and the heat transmitted to the intake-side fin 29 is radiated into air taken by a negative pressure inside the housing that is caused by the blower fan 28.

The above-mentioned tablet personal computer 2 as an embodiment is configured such that the intake-side fin 29 is provided to face the intake port 21A, and the intake-side heat sink 27B connected to the CPU 24 and the intake-side fin 29 is provided to transmit heat generated by the CPU 24 to the intake-side fin 29. Since heat is radiated not only into air discharged from the exhaust port 21B provided in the housing 21, but also into air taken from the intake port 21A provided in the housing 21, the CPU 24 can be cooled efficiently.

The above-mentioned tablet personal computer 2 is configured such that the intake-side fin 29 is provided inside the housing 21 to face the intake port 21A provided in the housing 21, and the intake-side heat sink 27B connected to the heat spreader 25, attached to the CPU 24 in a manner to adhere to the CPU 24, and the intake-side fin 29 is provided to transmit heat generated by the CPU 24 to the intake-side fin 29. Since heat generated by the CPU 24 is also radiated into air taken into the housing by a negative pressure inside the housing, the CPU 24 can be cooled efficiently.

The laptop personal computer 1 with the tablet personal computer 2 attached to the extended device 3 is configured such that the tablet personal computer 2 includes: the intake-side fin 29 provided inside the housing 21 to face the intake port 21A provided in the housing 21; and the intake-side heat sink 27B connected to the heat spreader 25, attached to the CPU 24 in a manner to adhere to the CPU 24, and the intake-side fin 29 to transmit heat generated by the CPU 24 to the intake-side fin 29; and the extended device 3 includes the fan unit (blower fans 57) 56 for supplying air to the intake port 21A in a state of attaching the tablet personal computer 2 to the extended device 3. Since heat generated by the CPU 24 is radiated into air forcibly supplied from the extended device 3 to the intake port 21A, the CPU 24 can be cooled efficiently.

The laptop personal computer (personal computer system) 1 with the tablet personal computer 2 attached to the extended device 3 is configured of the tablet personal computer 2, which includes: the intake-side fin 29 provided inside the housing 21 to face the intake port 21A provided in the housing 21; and the intake-side heat sink 27B connected to the heat spreader 25, attached to the CPU 24 in a manner to adhere to the CPU 24, and the intake-side fin 29 to transmit heat generated by the CPU 24 to the intake-side fin 29, and the extended device 3 to which the tablet personal computer 2 can be attached and which includes the fan unit (blower fans 57) 56 for supplying air to the intake port 21A in a state of attaching the tablet personal computer 2 thereto. Since heat generated by the CPU 24 is radiated into air forcibly supplied from the extended device 3 to the intake port 21A, the CPU 24 can be cooled efficiently.

Since the tablet personal computer 2 is configured to transmit heat generated by the CPU 24 to the fin 26 provided to face the exhaust port 21B and the intake-side fin 29 provided to face the intake port 21A, and radiate heat not only into air forcibly discharged from the exhaust port 21B but also into air taken in from the intake port 21A, the CPU 24 can be cooled efficiently.

When the tablet personal computer 2 is used independently, air is taken in from the intake port 21A by a negative pressure inside the tablet personal computer, while when the tablet personal computer 2 is attached to the extended device 3, air is forcibly supplied from the extended device 3 to the intake port 21A. Thus, when the tablet personal computer 2 is attached to the extended device 3, the CPU 24 can be cooled efficiently.

What is claimed is:

1. An electronic device, comprising:
    a housing with an exhaust port and an intake port, wherein the exhaust port is located on a first side of the housing and the intake port is located on a second side of the housing, wherein the first side and the second side are substantially opposite each other;
    a heat source contained in said housing;
    a heat transfer unit connected to said heat source;
    a first radiator located adjacent to said exhaust port, wherein said first radiator is connected to an exhaust-side of said heat transfer unit;
    a first blower fan, wherein said first blower fan discharges heat transmitted to said first radiator through said exhaust port; and
    a second radiator located adjacent to said intake port, wherein said second radiator is connected to an intake-side of said heat transfer unit, wherein said intake-side of said heat transfer unit is provided integrally with said exhaust-side of said heat transfer unit.

2. The electronic device of claim 1, wherein the heat source is an arithmetic processor.

3. The electronic device of claim 1, wherein the heat source is a central processing unit.

4. The electronic device of claim 1, wherein the second radiator is formed integrally with the heat transfer unit.

5. The electronic device of claim 1, wherein the housing has a front opening that contains a display.

6. The electronic device of claim 1, wherein the intake port is located in the center of a lower edge of the housing.

7. The electronic device of claim 1, further comprising an extended device to which the electronic device attaches comprising: a second blower fan, wherein said second blower fan supplies air to the electronic device via the intake port when said extended device is attached to said electronic device.

8. The electronic device of claim 1, wherein said intake-side of said heat transfer unit transmits heat to said second radiator.

9. The electronic device of claim 1, wherein said heat transfer unit comprises a heat sink.

10. The electronic device of claim 1, wherein said first blower fan comprises a centrifugal fan.

11. An electronic device, comprising:
    a housing including a processor and a memory;
    said housing configured with an exhaust port and an intake port, wherein the exhaust port is located on a first side of the housing and the intake port is located on a second side of the housing, wherein the first side and the second side are substantially opposite each other;
    a heat transfer unit thermally coupled to said processor;
    a first radiator located adjacent to said intake port and thermally coupled to an intake-side of said heat transfer unit; and
    a second radiator thermally coupled to an exhaust-side of said heat transfer unit and disposed proximate to the exhaust port, wherein said exhaust-side of said heat transfer unit is provided integrally with said intake-side of said heat transfer unit.

12. The electronic device of claim 11, further comprising a fan that circulates cooling air from said intake port to said exhaust port.

13. The electronic device of claim 11, further comprising an extended device to which the electronic device attaches, comprising: a second blower fan, wherein said second blower fan supplies air to the electronic device via the intake port when said extended device is attached to said electronic device.

14. The electronic device of claim 11, wherein said heat transfer unit comprises a heat sink.

15. A method, comprising:
- disposing a processor and a memory within a housing of an electronic device;
- the housing configured with an exhaust port and an intake port, wherein the exhaust port is located on a first side of the housing and the intake port is located on a second side of the housing, wherein the first side and the second side are substantially opposite each other;
- thermally coupling a first radiator to said processor using a heat transfer unit, said first radiator being disposed adjacent to said intake port and a intake-side of said heat transfer unit; and
- thermally coupling a second radiator to said processor using a heat transfer unit, said second radiator being disposed proximate to the exhaust port and an exhaust-side of said heat transfer unit, wherein said exhaust-side of said heat transfer unit is provided integrally with said intake-side of said heat transfer unit.

16. The method of claim 15, further comprising incorporating a fan into the housing, wherein the fan circulates cooling air from said intake port to said exhaust port.

17. The method of claim 15, further comprising disposing a second blower fan within a housing of an extended device to which the electronic device attaches, wherein said second blower fan supplies air to the electronic device via the intake port when said extended device is attached to said electronic device.

* * * * *